(12) United States Patent
Xie et al.

(10) Patent No.: US 11,753,742 B2
(45) Date of Patent: Sep. 12, 2023

(54) HIGH-TEMPERATURE FORMING DEVICE FOR IMPERFECT SINGLE-CRYSTAL WAFERS USED FOR NEUTRON MONOCHROMATOR

(71) Applicant: Changsha University of Science & Technology, Changsha (CN)

(72) Inventors: Wei Xie, Changsha (CN); Yibing Luo, Changsha (CN); Yonggang Tong, Changsha (CN); Xiaofeng Yu, Changsha (CN); Taishan Cao, Changsha (CN)

(73) Assignee: Changsha University of Science & Technology, Changsha (CN)

( * ) Notice: Subject to any disclaimer, the term of this patent is extended or adjusted under 35 U.S.C. 154(b) by 92 days.

(21) Appl. No.: 17/514,312

(22) Filed: Oct. 29, 2021

(65) Prior Publication Data
US 2022/0162770 A1 May 26, 2022

(30) Foreign Application Priority Data
Nov. 25, 2020 (CN) .......................... 202011335716.9

(51) Int. Cl.
| | |
|---|---|
| C30B 33/02 | (2006.01) |
| C30B 29/08 | (2006.01) |
| F27B 5/04 | (2006.01) |
| F27B 5/10 | (2006.01) |
| F27D 5/00 | (2006.01) |
| F27B 5/06 | (2006.01) |

(52) U.S. Cl.
CPC .............. *C30B 33/02* (2013.01); *C30B 29/08* (2013.01); *F27B 5/04* (2013.01); *F27B 5/10* (2013.01); *F27D 5/0018* (2013.01); *F27B 2005/068* (2013.01)

(58) Field of Classification Search
None
See application file for complete search history.

(56) References Cited

U.S. PATENT DOCUMENTS

2022/0162770 A1\* 5/2022 Xie ..................... F27B 17/0025

FOREIGN PATENT DOCUMENTS

JP H0586478 A \* 6/1993

\* cited by examiner

*Primary Examiner* — Scott R Kastler
(74) *Attorney, Agent, or Firm* — Mendelsohn Dunleavy, P.C.; Steve Mendelsohn

(57) ABSTRACT

A high-temperature forming device for imperfect single-crystal wafers used for a neutron monochromator includes a heating electric furnace, a temperature control system, a die system, a loading system, a vacuum protection system, and an auxiliary system. Where a furnace mouth of the heating electric furnace faces downwards, the heating electric furnace can be lifted vertically or a hearth of the heating electric furnace can be opened and closed. A vacuum protection cavity is formed by a glass cover and a blocking flange, a through hole is formed in one end of the glass cover, and the other end of the glass cover is closed. An operation opening is formed in the glass cover, the die system includes an upper die, a middle die, and a lower die, the middle die is a composite die.

5 Claims, 1 Drawing Sheet

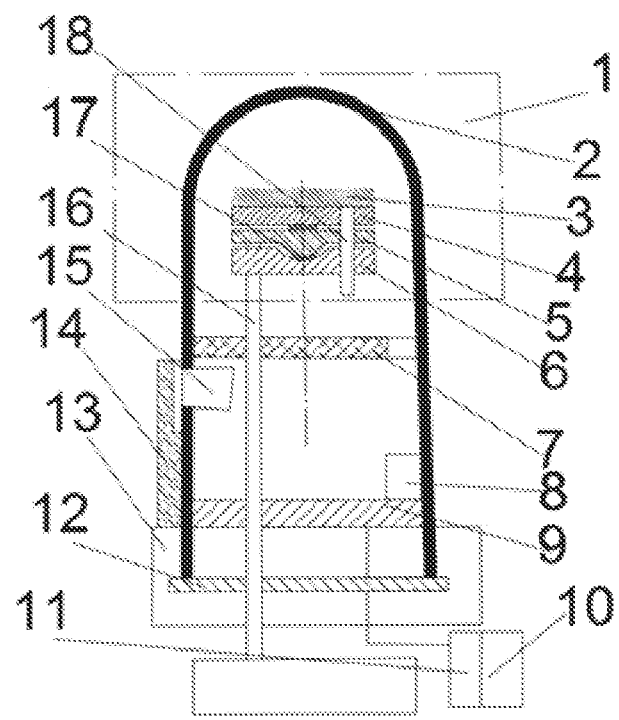

HIGH-TEMPERATURE FORMING DEVICE FOR IMPERFECT SINGLE-CRYSTAL WAFERS USED FOR NEUTRON MONOCHROMATOR

CROSS REFERENCE TO RELATED APPLICATION

This patent application claims the benefit and priority of Chinese Patent Application No. 202011335716.9 filed on Nov. 25, 2020, the disclosure of which is incorporated by reference herein in its entirety as part of the present application.

TECHNICAL FIELD

The present disclosure belongs to a high-temperature forming device for a sheet, and particularly relates to a high-temperature forming device for imperfect single-crystal wafers used for a neutron monochromator.

BACKGROUND ART

Slow neutrons provided by a reactor and an accelerator generally have continuous energy spectra, but neutron scattering experiments provide "monochromatic neutrons" with a specific narrow wavelength range. The desired "monochromatic neutrons" are obtained by reflection and transmission from a white-light neutron source by using Bragg coherent scattering of crystals, which is the most frequently-used method for neutron scattering spectrometers. The neutron monochromator is used for forming required monochromatic neutrons by utilizing Bragg reflection of crystals. Therefore, the neutron monochromator is a common neutron optical assembly in a neutron scattering spectrometer, has a significant impact on the resolution of the spectrometer and the intensity of an incident neutron beam, and is referred to as the "heart" of the neutron scattering spectrometer. In order to improve the intensity of emergent neutrons, the adoption of imperfect crystals is still preferable for the neutron monochromator or neutron analyzer.

The artificial single-crystal is composed of very small mosaic blocks each of which has a perfect periodically distributed lattice structure therein, and a disordered atomic layer with the thickness of several angstroms exists between the mosaic blocks. In order to obtain sufficient neutron intensity, the width of the mosaic crystal for the monochromator must match the horizontal divergence of the incident beam, approximately 0.3-0.5°. And the artificial single crystal has very low mosaicity, and can be used as a neutron monochromator after being increased by dozens of times. The introduction of a large mosaic structure into the crystal is called a mosaic spread technology, to increase the mosaic width, which greatly improves the Bragg reflection intensity of the crystal, and meets the requirement of a neutron spectrometer on the intensity.

At present, a single-crystal hot-pressing deformation technology (Chinese patent application No. 200710151357. X, entitled "a germanium single-crystal hot-pressing deformation device", filed on Sep. 30, 2007 by Xiao Hongwen et al., and Chinese application patent No. 200710151358.4, entitled "a germanium single-crystal hot-pressing deformation technology", filed on Sep. 30, 2007 by Xiao Hongwen et al.) is mainly adopted for preparing the imperfect crystal wafers for the neutron monochromator. However, the method for preparing the imperfect single-crystal germanium sheets repeatedly experiences a cycle process of forward bending, leveling, and reverse bending. Because the germanium sheet needs to deform under vacuum and high temperature, each station can complete only one deformation procedure, and each procedure needs germanium sheet loading, vacuum protection, heating, forming, and cooling, thus the production process is long, and the efficiency is low.

SUMMARY

In view of the disadvantages of existing equipment, the present disclosure provides a high-temperature forming device for imperfect single-crystal wafers used for a neutron monochromator. The device includes a heating electric furnace, a temperature control system, a die system, a loading system, a vacuum protection system, and an auxiliary system.

The temperature control system includes a temperature measurement instrument and a temperature controller, the temperature measurement is performed by a thermocouple, and the temperature control is performed by the temperature controller matched with the thermocouple.

The highest heating temperature of the heating electric furnace is not higher than 1350° C. A hearth is cylindrical, a furnace mouth faces downwards, and the heating electric furnace can be vertically lifted or hearth can be opened and closed.

The vacuum system includes a glass cover, a glass cover supporting plate, a vacuum pump, a vacuum gauge, a joint, and pipelines.

In some embodiments, a body of the glass cover is shaped as a cylinder, one end of the body is closed through a dome, a through hole is formed in the other end of the body, when the glass cover is in a protection state, the glass cover is vertically placed, the other end with the through hole faces downwards and is supported by the glass cover supporting plate located in a water-cooled jacket box of an operation table, when the device is in an operating state, the liquid level in the water-cooled jacket box is always higher than an end face of the other end with the through hole of the glass cover, an operation opening is formed in a cylindrical surface of the glass cover and provided with a glove made of an airtight material, and the glove and the glass cover are sealed via a flange in a gluing mode.

In some embodiments, the pipeline is connected with the vacuum pump and the glass cover, the pipeline is in a rigid pipe form, the rigid pipe communicates with an inner cavity of the glass cover through the joint, the other end of the rigid pipe is connected with the vacuum gauge and the vacuum pump, and the connection is in a buckle, thread, or glue joint sealing form.

A connecting wire of the thermocouple is led out of the glass cover from a blocking flange, and the connecting wire and the blocking flange are sealed by a gluing method.

A main body of the operation table may be a water-cooled jacket box, an annular groove may be formed in the water-cooled jacket box, and the glass cover supporting plate may be arranged below the annular groove and drives the glass cover to move up and down.

The auxiliary system may include a heat insulation pad, a storage rack, and a protection layer.

In some embodiments, the heat insulation pad may be arranged above the blocking flange, and an opening which is convenient to remove or place the imperfect single-crystal wafers may be formed in the heat insulation pad. When the imperfect single-crystal wafers are mounted in or removed from the device, the glass cover is moved upwards, and the heat insulation pad is located below the operation opening, and when the device is in a heated state, the glass cover is moved downwards, and the heat insulation pad is located above the operation opening.

In some embodiments, the storage rack is located between the heat insulation pad and the blocking flange, and the positions of the heat insulation pad, the storage rack, and the blocking flange are relatively fixed.

In some embodiments, the protection layer is of a composite structure and comprises a heat insulation layer and a heat dissipation layer. When the glass cover is in the heated state, the protection layer wraps the operation opening of the glass cover and a partial shell below the operation opening of the glass cover to prevent the glove from being affected by the heating electric furnace.

The die system may include an upper die, a middle die, a lower die, a die base, and a guide column, which are all arranged in the glass cover and are made of heat-resistant steel, stainless steel, or ceramic, the upper die may be fixed to the die base, the middle die and the lower die are able to be moved up and down, and the positioning of the middle die and the lower die may be achieved through the guide column fixed to the die base.

In some embodiments, the upper die may be a leveling die, and the upper die and the middle die form a set of leveling dies, or the upper die and the die base may be integrated into one piece.

In some embodiments, the middle die may be a composite die of a leveling male die and a bending male die which are arranged back to back, a leveling part of the middle die and a leveling part of the upper die may be arranged oppositely (as shown in FIGURE) to form a leveling die of the imperfect single-crystal wafers, the bending male die of the middle die and the lower die as a bending female die form a bending die, and the loading system of the middle die adopts independent loading and control.

In some embodiments, the lower die is a single bending female die, and the loading of the lower die adopts independent loading and control.

The loading system adopts a hydraulic or pneumatic loading mode, the middle die and the lower die are objects to be loaded, and the loading pressures, the loading speeds, and the loading times of the middle die and the lower die are independently regulated and controlled.

The embodiments have the following advantages:

Firstly, bending and leveling dies are integrated, two germanium sheets can be formed at the same time, and thus the production efficiency is improved.

Secondly, the glove is adopted, so that the operation can be performed before the imperfect single-crystal wafers are cooled to room temperature, and the cooling waiting time can be greatly reduced.

Thirdly, the storage rack for germanium sheet is arranged in the glass cover, so that multiple imperfect single-crystal wafers can be formed in one production cycle.

Fourthly, the heat insulation pad is adopted, so that the influence of the heating area on the storage rack and the glove is reduced.

Fifthly, when the glass cover is in the heated state, the operation opening of the glass cover and the partial shell below the operation port of the glass cover are wrapped by the heat insulation layer and the heat dissipation layer, so that the glove is further protected.

Sixthly, a structure of an upper die, a middle die, and a lower die is adopted, and when the upper die and the middle die are attached together, the device can be independently used as a bending die; otherwise, the dies can also be used as a leveling die.

BRIEF DESCRIPTION OF THE DRAWINGS

The present disclosure is further described below in combination with the attached FIGURE.

FIGURE is a schematic diagram of a high-temperature forming device for imperfect single-crystal wafers used for a neutron monochromator disclosed by the present disclosure.

Where, 1 denotes a heating electric furnace with a furnace mouth facing downwards, and the electric furnace can be moved vertically or a hearth of electric furnace can be opened and closed; 2 denotes a glass cover made of high-silicon glass or quartz glass; 3 denotes a die base made of metal; 4 denotes an upper die made of heat-resistant steel or stainless steel or ceramic; 5 denotes a middle die made of heat-resistant steel or stainless steel or ceramic; 6 denotes a lower die made of heat-resistant steel or stainless steel or ceramic; 7 denotes a heat insulation pad made of a porous heat-insulation material; 8 denotes a storage rack made of a metal material; 9 denotes a blocking flange made of a metal material, and the blocking flange and the glass cover are sealed in a dynamic pressure sealing manner; 10 denotes a vacuum pump; 11 denotes a temperature control system which adopts a thermocouple and a temperature controller; 12 denotes a glass cover supporting plate made of a metal material; 13 denotes an operation table, a main body of which is a water-cooled jacket box and made of a metal material; 14 denotes a protection layer which is of a composite structure, an inner layer is a heat dissipation layer, the heat is dissipated vertically downward, and an outer layer is a heat insulation layer; 15 denotes an operation glove made of a flexible waterproof material; 16 denotes a loading system, which applies a load hydraulically or pneumatically, and the loading pressures, the loading speeds, and the loading times of the middle die and the lower die are independently regulated and controlled; 17 denotes an imperfect single wafer; and 18 denotes a guide column, and the upper die is made of heat-resistant steel or stainless steel or ceramic.

DETAILED DESCRIPTION OF THE EMBODIMENTS

The principle of the device is as shown in FIGURE. In FIGURE, reference character 1 denotes a heating electric furnace which has a hearth shaped as a cylinder, and a furnace mouth of the electric furnace faces downwards. The heating electric furnace can be moved along a guide rail (not shown). Reference character 2 denotes a glass cover made of quartz glass. Reference character 3 denotes a die base made of metal. Reference character 4 denotes an upper die made of heat-resistant steel or stainless steel or ceramic, Reference character 5 denotes a middle die made of heat-resistant steel or stainless steel or ceramic. Reference character 6 denotes a lower die made of heat-resistant steel or stainless steel or ceramic. Reference character 7 denotes a heat insulation pad made of porous cotton. Reference character 8 denotes a storage rack made of a metal material. Reference character 9 denotes a blocking flange made of a steel material, and the blocking flange and the glass cover are sealed in a seal ring form. Reference character 10 denotes a vacuum pump. Reference character 11 denotes a temperature control system which adopts an S-shaped thermocouple. Reference character 12 denotes a glass cover supporting plate made of steel. Reference character 13 denotes an operation table, and a main body of which is a water-cooled jacket box and made of steel. Reference character 14 denotes a protection layer which is of a composite structure and includes an inner layer and an outer layer. A heat dissipation media in the inner layer is water, and the heat is dissipated vertically downward. The outer layer is a heat insulation layer, and a water-resisting layer is arranged between the heat insulation layer and the heat dissipation layer. Reference character 15 denotes an operation glove made of rubber. Reference character 16 denotes a loading system which applies a load pneumatically, and the loading pressure, the loading speed, and the loading time of the middle die and the lower die are independently regulated and controlled. Reference character 17 denotes an imperfect single wafer. Reference character 18 denotes a guide column, and the upper die is made of heat-resistant steel.

What is claimed is:

1. A high-temperature forming device for imperfect single-crystal wafers used for a neutron monochromator, the device comprising:
    a heating electric furnace having a furnace mouth facing downwards, and capable of being lifted vertically or having a hearth capable of being opened and closed,
    a temperature control system including a thermocouple and a temperature controller configured for controlling a temperature of a workpiece based on the thermocouple,
    a die system including an upper die, a middle die, a lower die, a die base, and a guide column which are all arranged in a glass cover and are configured for manufacturing the workpiece, wherein, the upper die is fixed to the die base, the middle die and the lower die are able to be moved up and down, and positioning of the middle die and the lower die is achieved through the guide column fixed to the die base,
    a loading system in a hydraulic or pneumatic loading mode configured for loading the middle die and the lower die,
    a vacuum protection system including
    the glass cover, a vacuum pump, a vacuum gauge, a joint, a blocking flange, and a pipeline, wherein:
        a body of the glass cover is shaped as a cylinder,
        one end of the body is closed,
        a through hole is formed in an other end of the body, the glass cover is vertically placed,
        the other end with the through hole faces downwards and is located in a water-cooled jacket box of an operation table,
        the water-cooled jacket box is configurable such that a liquid level in the water-cooled jacket box is higher than an end face of the other end with the through hole of the glass cover,
        an operation opening is formed in a cylindrical surface of the glass cover and provided with a glove made of an airtight material, and
        the glove and the glass cover are sealed via a flange and glue,
        the other end with the through hole of the glass cover is supported by a glass cover supporting plate, which is capable of moving up and down in a vertical direction, and
        the pipeline is connected with the vacuum pump and the glass cover, one end of the pipeline communicates with an inner cavity of the glass cover through the joint, an other end of the pipeline is connected with the vacuum gauge and the vacuum pump, and
    an auxiliary system including a heat insulation pad, a storage rack, and a protection layer, wherein:
        the heat insulation pad is arranged above the blocking flange, and a taking-out opening is formed in the heat insulation pad,
        the storage rack is located between the heat insulation pad and the blocking flange, and positions of the heat insulation pad, the storage rack, and the blocking flange are fixed with respect to one another, and
        the protection layer is of a composite structure and comprises a heat insulation layer and a heat dissipation layer, and the protection layer wraps the operation opening of the glass cover and a partial shell below the operation opening of the glass cover to prevent the glove from being affected by the heating electric furnace.

2. The high-temperature forming device according to claim 1, wherein a main body of the operation table is the water-cooled jacket box, an annular groove is formed in the water-cooled jacket box, and the glass cover supporting plate is arranged below the annular groove and drives the glass cover to move up and down.

3. The high-temperature forming device according to claim 1, wherein:
    when the imperfect single-crystal wafers are mounted in or removed from the device, the glass cover is moved upwards, and the heat insulation pad is located below the operation opening; and
    when the device is in a heated state, the glass cover is moved downwards, and the heat insulation pad is located above the operation opening.

4. The high-temperature forming device according to claim 1, wherein:
    the upper die is a leveling die, wherein the upper die and the middle die form a set of leveling dies, or the upper die and the die base are integrated into one piece; and
    the middle die is a composite die of a leveling die and a bending male die which are arranged back to back, a leveling part of the middle die and a leveling part of the upper die are arranged oppositely to be assembled into a leveling die, and the bending male die of the middle die and the lower die as a bending female die form a bending die.

5. The high-temperature forming device according to claim 1, wherein the loading system is configured to independently regulate and control loading pressures and loading times of the middle die and the lower die.

* * * * *